US012424716B2

(12) United States Patent
Aleksov et al.

(10) Patent No.: US 12,424,716 B2
(45) Date of Patent: Sep. 23, 2025

(54) RF FILTERS AND MULTIPLEXERS MANUFACTURED IN THE CORE OF A PACKAGE SUBSTRATE USING GLASS CORE TECHNOLOGY

(71) Applicant: Intel Corporation, Santa Clara, CA (US)

(72) Inventors: Aleksandar Aleksov, Chandler, AZ (US); Neelam Prabhu Gaunkar, Chandler, AZ (US); Veronica Strong, Hillsboro, OR (US); Georgios C. Dogiamis, Chandler, AZ (US); Telesphor Kamgaing, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 923 days.

(21) Appl. No.: 17/354,903

(22) Filed: Jun. 22, 2021

(65) Prior Publication Data

US 2022/0407199 A1    Dec. 22, 2022

(51) Int. Cl.
| | |
|---|---|
| *H01L 21/48* | (2006.01) |
| *H01L 23/498* | (2006.01) |
| *H01P 1/20* | (2006.01) |
| *H05K 1/02* | (2006.01) |

(52) U.S. Cl.
CPC .......... *H01P 1/2002* (2013.01); *H01L 21/486* (2013.01); *H01L 23/49827* (2013.01); *H01L 23/49838* (2013.01); *H05K 1/0243* (2013.01); *H05K 2201/1006* (2013.01)

(58) Field of Classification Search
CPC .......................... H01P 1/2002; H01L 23/49827
USPC ........................................................ 361/766
See application file for complete search history.

(56) References Cited

U.S. PATENT DOCUMENTS

| | | | | |
|---|---|---|---|---|
| 6,483,404 | B1 * | 11/2002 | Ammar | H01P 1/20372 |
| | | | | 333/204 |
| 10,490,887 | B2 * | 11/2019 | Schlaffer | H01Q 1/48 |
| 2005/0088258 | A1 * | 4/2005 | Fischer | H01P 1/20381 |
| | | | | 333/204 |
| 2007/0268675 | A1 * | 11/2007 | Chinda | H05K 3/205 |
| | | | | 29/829 |
| 2013/0120952 | A1 * | 5/2013 | Kim | H05K 3/4688 |
| | | | | 174/250 |
| 2018/0159203 | A1 * | 6/2018 | Baks | H01Q 9/045 |
| 2020/0067198 | A1 * | 2/2020 | Hunziker | H01L 24/19 |

* cited by examiner

*Primary Examiner* — Andargie M Aychillhum
(74) *Attorney, Agent, or Firm* — Schwabe, Williamson & Wyatt, P.C.

(57) ABSTRACT

Embodiments disclosed herein include package substrates with filter architectures. In an embodiment, a package substrate comprises a core with a first surface and a second surface, and a filter embedded in the core. In an embodiment, the filter comprises a ground plane, where the ground plane is substantially orthogonal to the first surface of the core, and a resonator adjacent to the ground plane.

25 Claims, 14 Drawing Sheets

RF FILTERS AND MULTIPLEXERS MANUFACTURED IN THE CORE OF A PACKAGE SUBSTRATE USING GLASS CORE TECHNOLOGY

TECHNICAL FIELD

Embodiments of the present disclosure relate to electronic packages, and more particularly to package substrates with a glass core and integrated RF filtering and multiplexer architectures.

BACKGROUND

With a surge in demand for high-speed communication services, low latency solutions with high data rates and bandwidth density have emerged. To meet the requirements of higher bandwidth density at millimeter wave or RF frequencies, multiplexed solutions are required. Such solutions employ a combination of bandpass filters to combine different operational bands, thereby enabling larger bandwidths and higher data rates. Most of these multiplexed solutions are implemented on package instead of the die due to lower losses in organic substrates at millimeter wave frequencies.

However, existing on-package implementations are limited in some ways due to limits on minimum achievable design specifications and process tolerances. For example, in coupled-line filters, variations in trace width, trace space, and dielectric thickness impact in-band insertion loss (e.g., due to increased coupling distances between resonators) and required operational bandwidth. In cavity filters, discrete via misalignment impacts in-band insertion loss and operation bandwidth.

EMBODIMENTS OF THE PRESENT DISCLOSURE

Figure 1A:
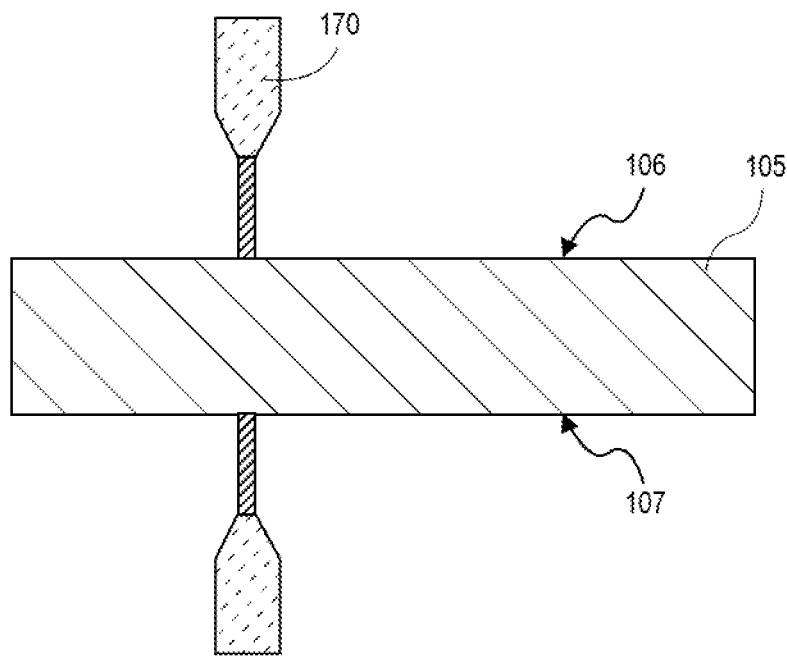
FIG. 1A is a cross-sectional illustration of a glass core with top and bottom surfaces that are being exposed with a laser, in accordance with an embodiment.

Described herein are package substrates with a glass core and integrated RF filtering and multiplexer architectures, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, existing filter technologies to enable millimeter wave and an RF frequencies are desired to be located on the package substrate due to low losses in dielectric material, compared to in the semiconductor die. However, current process limitations limit the effectiveness of filters that are on the package substrate. Particularly, line and space dimensions and alignment issues render on-package filters less effective than is currently desired.

Accordingly, embodiments disclosed herein include package integrated filter architectures that are fabricated through the use of laser-assisted etching process. In a particular embodiment, the filter components are fabricated in the package core (e.g., a glass core). The laser-assisted etching process allows for smaller dimensions, closer spacings, and improved alignment. Therefore, filtering architectures for millimeter wave and RF frequencies are able to be fabricated in the package core.

Generally, laser-assisted etching processes involve exposing the core to a laser. The laser exposure results in a change in the morphology of the exposed regions. For example, in a glass core, the structure may turn from amorphous to crystalline after exposure by the laser. The change in structure allows for selective etching of the exposed regions. After etching, conductive material may be disposed in the openings.

The laser-assisted etching process allows for the formation of crack free, high-density via holes and planes into the core substrate. Whereas existing through core vias (e.g., PTHs) have diameters of 100 µm or larger and pitches of 250 µm or larger, the laser-assisted etching process may enable hole diameters and plane thicknesses that are approximately 50 µm or smaller and pitches that are approximately 40 µm or larger. Diameters of the holes and thicknesses of planes may be able to be approximately 10 µm without masks, and potentially as small as 2 µm when a hardmask is also used. The thickness of the core may also be between approximately 100 µm and 1,000 µm. Though it is to be appreciated that embodiments may also apply to larger and/or smaller hole diameters, plane thicknesses, pitches, and core substrate thicknesses.

Referring now to FIGS. 1A-1D, a series of cross-sectional illustrations depicting a process for forming a hole in a core substrate 105 using a laser-assisted etching process is shown, in accordance with an embodiment. In FIGS. 1A-1D, the hole is shown in a single cross-section. However, it is to be appreciated that the hole may be extended to form trenches suitable for the formation of vertically oriented planes in addition to standard vias. The ability to form both vias and vertically oriented planes allows for the formation of filter architectures, such as, but not limited to, coupled line filters and cavity filters.

As shown in FIG. 1A, the core substrate 105 is exposed by a laser 170. The laser 170 may be irradiated over both a first surface 106 and a second surface 107. However, the laser 170 may only irradiate a single surface of the core substrate 105 in other embodiments. In order to form a trench for a vertically oriented plane, the laser 170 may be scanned across the surface of the core substrate 105.

In an embodiment, the core substrate 105 may comprise a material that is capable of forming a morphological change as a result of the exposure by the laser 170. For example, in the case of a glass core substrate 105, the morphological change may result in the conversion of an amorphous crystal structure to a crystalline crystal structure. While glass is used as an example here, it is to be appreciated that the core substrate 105 may also comprise ceramic materials, silicon, or other non-conductive semiconductor materials. In an embodiment, the core substrate 105 may have a thickness between the first surface 106 and the second surface 107 that is between 100 µm and 1,000 µm. However, it is to be appreciated that larger or smaller thicknesses may also be used for the core substrate 105 in other embodiments.

Figure 1B:
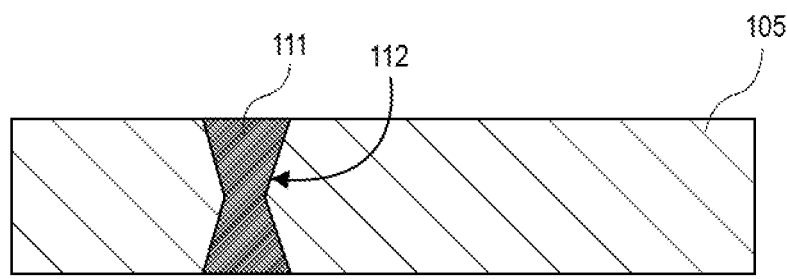
FIG. 1B is a cross-sectional illustration of the glass core with regions that have their morphology altered by the laser, in accordance with an embodiment.

Referring now to FIG. 1B, a cross-sectional illustration of the core substrate 105 after the morphological change has occurred is shown, in accordance with an embodiment. As shown, an exposed region 111 is provided through a thickness of the core substrate 105. In an embodiment, the exposed region 111 may have sidewalls 112 that are sloped. That is, the sidewalls 112 may not be substantially vertical (with respect to the first surface 106 and the second surface 107). In a particular embodiment, the exposed region 111 may have an hourglass shaped cross-section that results from exposure from laser exposure on both the first surface 106 and the second surface 107. As used herein, an hourglass shaped cross section may refer to a shape that starts with a first width on a first end, decreases in width while moving away from the first end until reaching a minimum width between the first end and a second end, and increasing in width while moving from the minimum width in the middle towards the second end. That is, the shape may have a middle region that is narrower in width than the widths of the opposing ends. In an embodiment, the sidewalls 112 may have a slope that is approximately 10° or less away from vertical. While shown with sloped sidewalls 112, it is also to be appreciated that embodiments may include substantially vertical sidewalls depending on the laser parameters and the material of the core substrate 105.

Figure 1C:
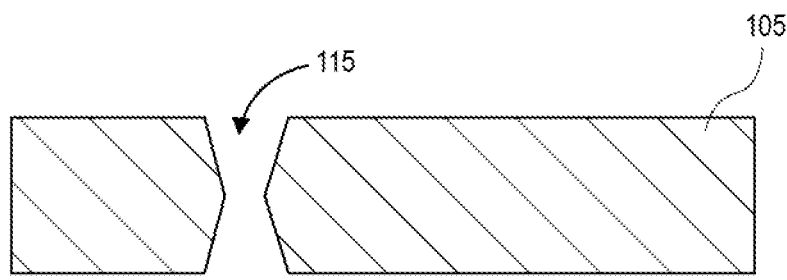
FIG. 1C is a cross-sectional illustration of the glass core with a via hole through a thickness of the glass core, in accordance with an embodiment.

Referring now to FIG. 1C, a cross-sectional illustration of the core substrate 105 after the exposed region 111 is removed to form a hole 115 through the core substrate 105 is shown, in accordance with an embodiment. Similarly, in the case of forming a vertically oriented plane, a trench may be formed instead of a hole 115. In an embodiment, the hole 115 may be formed with an etching process that is selective to the exposed region 111 over the remainder of the core substrate 105. The etch selectivity of the exposed region 111 to the remainder of the core substrate 105 may be 10:1 or greater, or 50:1 or greater. That is, while selective to the exposed region 111, some portion of the core substrate 105 may also be etched, resulting in the thickness of the core substrate 105 being slightly reduced. In an embodiment, the etchant may be a wet etching chemistry.

Figure 1D:
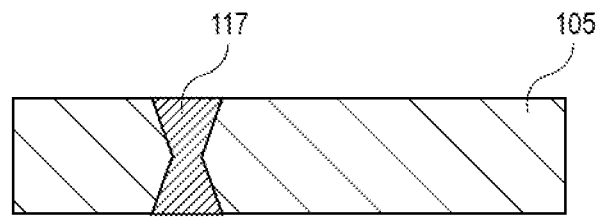
FIG. 1D is a cross-sectional illustration of the glass core with a via through the thickness of the glass core, in accordance with an embodiment.

Referring now to FIG. 1D, a cross-sectional illustration of the core substrate 105 after a via 117 is formed in the hole 115 is shown, in accordance with an embodiment. In the case of a hole 115 that is extended into a trench, the via 117 may instead be a vertically oriented plane. In an embodiment, the via 117 may be deposited with a plating process or any other suitable deposition process.

In an embodiment, the hole 115 may have a maximum diameter that is approximately 100 µm or less, approximately 50 µm or less, or approximately 10 µm or less. The pitch between individual holes 115 in the core substrate 105 may be between approximately 10 µm and approximately 100 µm in some embodiments. The small diameters and pitch (compared to traditional PTH vias that typically have diameters that are 100 µm or larger and pitches that are 100 µm or larger) allow for high density integration of vias and vertically oriented planes.

In FIGS. 1A-1D only a single cross-section of the core substrate 105 is shown for simplicity. However, it is to be appreciated that the shape of the vias 117 may take substantially any form. This is because the laser providing the morphological change in the core substrate 105 may be moved in a controllable manner. Examples of various plan views of a vias 217 in a core substrate 205 are shown in FIGS. 2A and 2B.

Figure 2A:
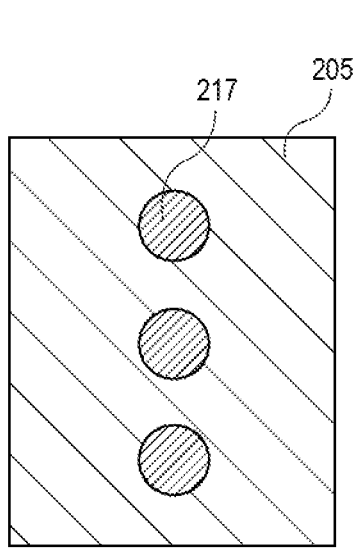
FIG. 2A is a plan view illustration of the glass core with a plurality of circular vias, in accordance with an embodiment.
Figure 2B:
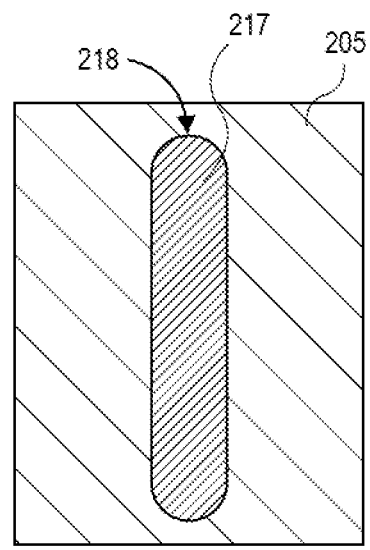
FIG. 2B is a plan view illustration of the glass core with a vertical via plane, in accordance with an embodiment.

Referring now to FIG. 2A, a plan view illustration of a core substrate 205 with a plurality of circular vias 217 is shown, in accordance with an embodiment. While three vias 217 are shown, it is to be appreciated that any number of vias 217 may be provided in any configuration. Referring now to FIG. 2B, a plan view illustration of a core substrate 205 with a via 217 that is extended along one direction to form a vertically oriented plane is shown, in accordance with an embodiment. Such a structure 217 may be referred to herein as a "via plane" or simply a "plane". The plane 217 may have a thickness through the core substrate 205 that is substantially uniform, while also being extended in a direction, as opposed to having a width and length that are substantially uniform. As shown in FIG. 2B, the ends of the plane 217 may be rounded surfaces 218. The rounded surfaces may be the result of the shape of the laser irradiation. That is, the focus of the laser may be substantially circular in some embodiments. In FIG. 2B, the plane 217 is shown as a straight line. However, it is to be appreciated that the via plane 217 may also include turns (e.g., to form a conductive shell).

Figure 3:
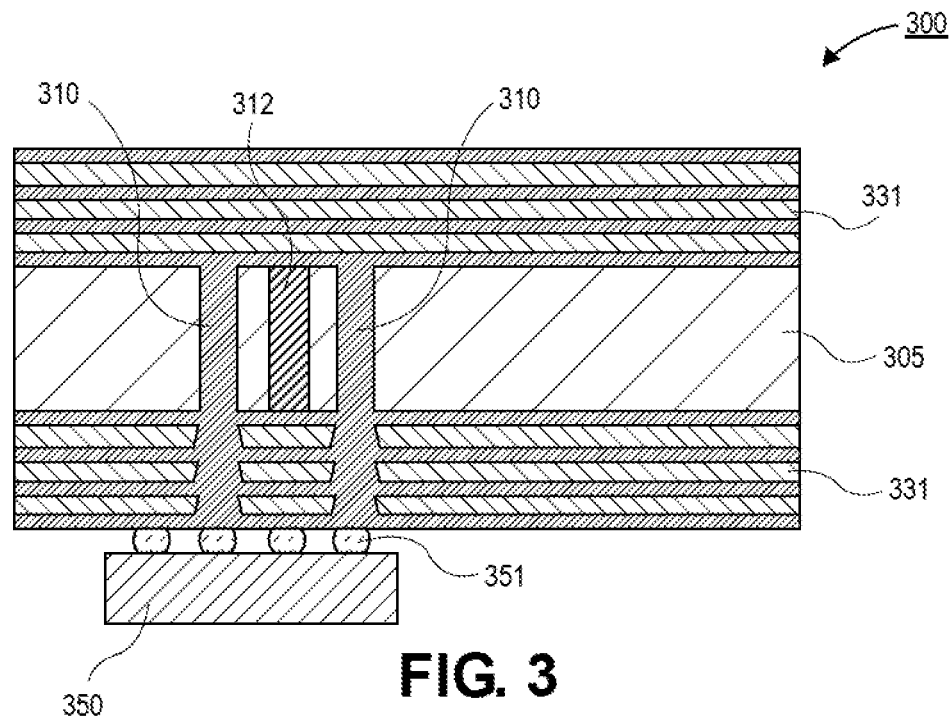
FIG. 3 is a cross-sectional illustration of an electronic package with filters embedded in a glass core, in accordance with an embodiment.

Referring now to FIG. 3, a cross-sectional illustration of an electronic package 300 is shown, in accordance with an embodiment. In an embodiment, the electronic package 300 comprises a package substrate with a core 305 and buildup layers 331 above and below the core 305. A die 350 may be coupled to the package substrate by first level interconnects (FLIs) 351.

In an embodiment, one or more filters 310 may be embedded in the core 305. In the illustrated embodiment, the filters 310 are illustrated as being vertically oriented. The filters 310 are shown as a simple via in FIG. 3, but it is to be appreciated that more complex filter architectures fabricated using laser-assisted etching processes may be included in the core 305, as will be described in greater detail below. In an embodiment, the filters 310 may be adjacent to a ground plane 312. The ground plane 312 may also be fabricated with laser-assisted etching processes. It is to be appreciated that embodiments disclosed herein provide the filters 310 primarily within the core 305. This is different than existing architectures where the filters 310 are provided primarily in the buildup layers 331 In yet another embodiment, feature 310 may be ground planes, and feature 312 may be the filter.

Figure 4A:
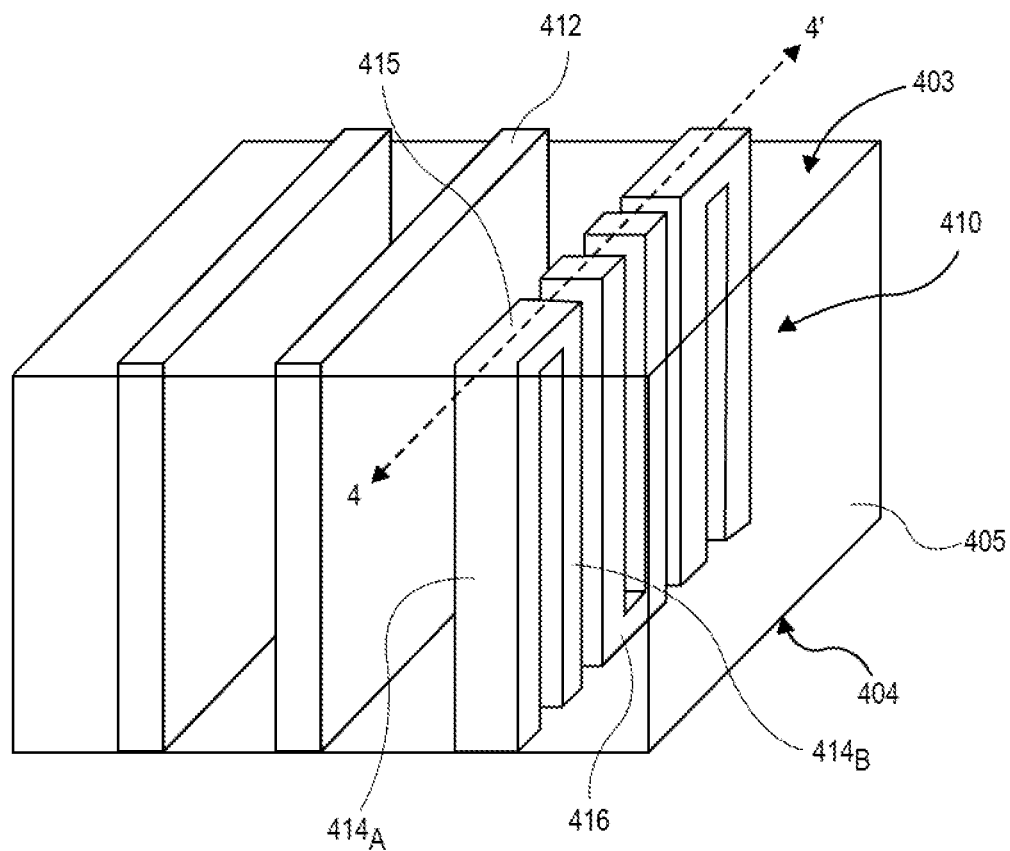
FIG. 4A is a perspective view illustration of a coupled-line filter with vertically oriented hairpin resonators, in accordance with an embodiment.

Referring now to FIG. 4A, a perspective view illustration of a filter 410 is shown, in accordance with an embodiment. In an embodiment, the filter 410 may be a coupled-line filter 410, such as a hairpin filter. As such, the resonator structures (e.g., hairpins formed by vias $414_A$, $414_B$, and a trace 415 (or 416)) are adjacent to a ground plane 412. In the illustrated embodiment, three hairpin resonators are shown. However, it is to be appreciated that the filter 410 may comprise one or more hairpin resonators depending on the needs of the filter 410.

In an embodiment, the vias $414_A$ and $414_B$ are fabricated using a laser-assisted etching process, such as the process described above. The connecting traces 415 may be provided over a top surface 403 of the core 405, and the connecting traces 416 may be provided over a bottom surface 404 of the core 405. The traces 415 and 416 may be fabricated with standard metal plating and patterning processes used to form conductive features in the buildup layers. However, in other embodiments, the traces 415 and/or 416 may be embedded in the core 405 as well.

In an embodiment, the filter design depends on several parameters, such as the trace width, trace space, gap between adjacent resonators, and overlap length. Typically, each resonator length corresponds to $\lambda/2$ and the overlap length between adjacent resonators is $\lambda/4$. Here, $\lambda$ refers to the wavelength corresponding to the operational frequency or frequency band of the filter. Therefore, as shown in FIG. 4A, the height of the core 405 may correspond to the filter's 410 operational frequency range. Besides resonator length, the trace width, trace space, and coupling gap are also vital contributors towards meeting the specifications of bandwidth, insertion loss, and stop-band attenuation. The laser-assisted etching process brings the added advantage of minimal coupling distances between adjacent resonators. This is particularly advantageous for obtaining low insertion loss at the cost of a slight reduction in bandwidth.

Figure 4B:
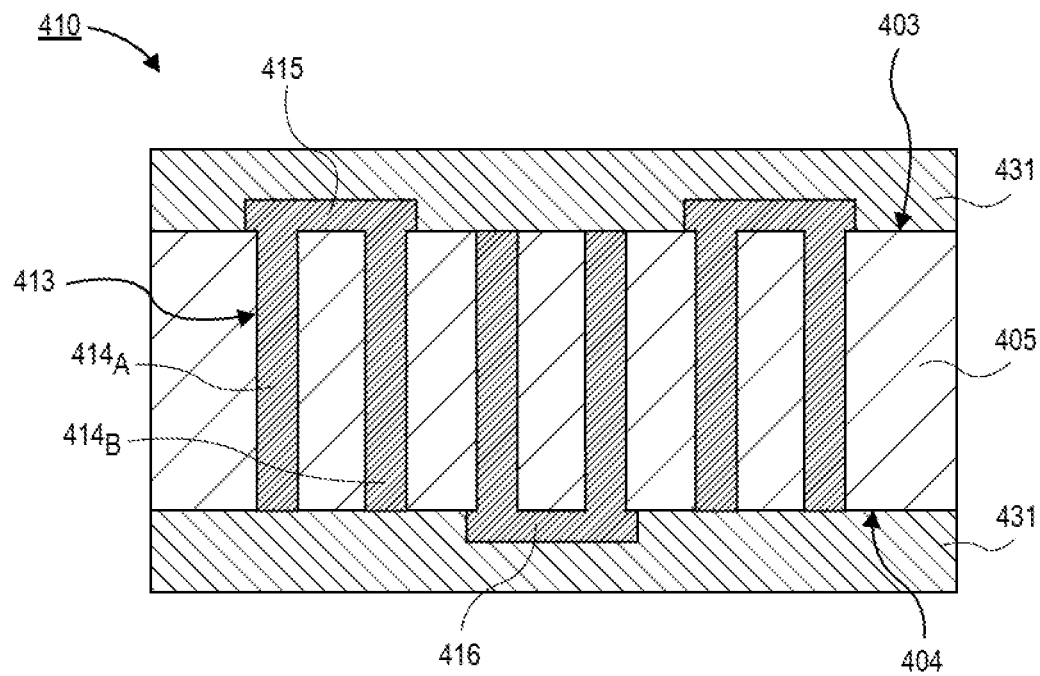
FIG. 4B is a cross-sectional illustration of the hairpin resonators, in accordance with an embodiment.

Referring now to FIG. 4B, a cross-sectional illustration of the filter 410 in FIG. 4A along line 4-4' is shown, in accordance with an embodiment. As shown, the vias $414_A$ and $414_B$ extend through an entire thickness of the core 405. Pairs of vias $414_A$ and $414_B$ are coupled together by a trace 415 or 416 over the core 405. For example, traces 415 are provided over the top surface 403 of the core 405, and the trace 416 is provided over the bottom surface 404 of the core 405. Buildup layers 431 may also be provided above and below the core 405.

Figure 4C:
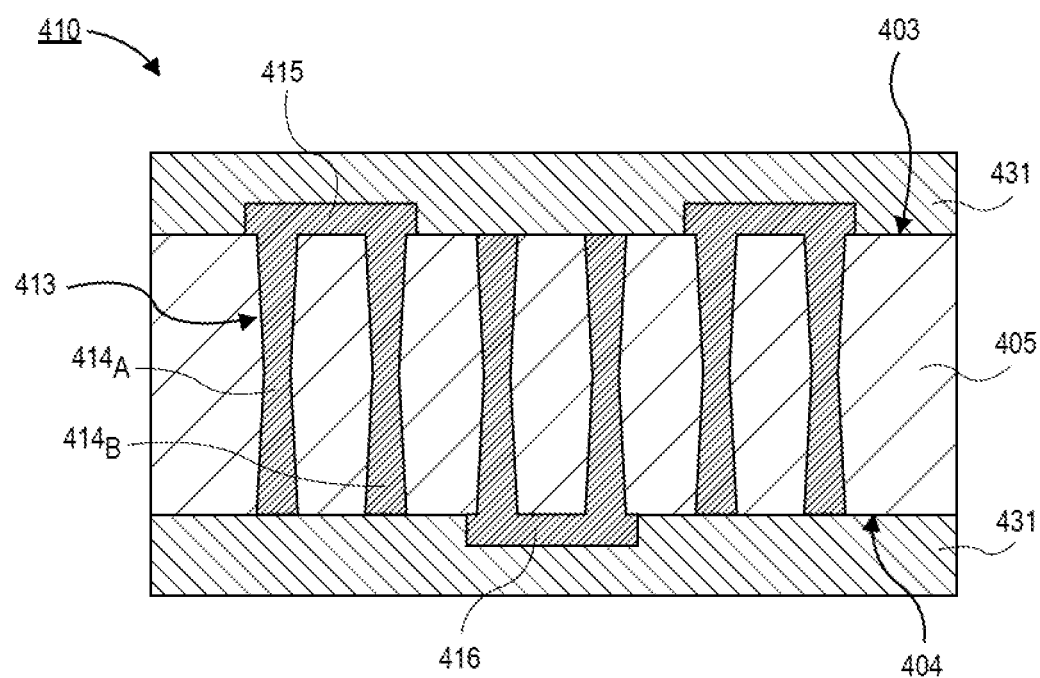
FIG. 4C is a cross-sectional illustration of the hairpin resonators with hourglass shaped cross-sections, in accordance with an embodiment.

Referring now to FIG. 4C, a cross-sectional illustration of the filter 410 in FIG. 4A along line 4-4' is shown, in accordance with an additional embodiment. The filter 410 in FIG. 4C may be substantially similar to the filter 410 in FIG. 4B, with the exception of the sidewalls 412 of the vias 414. Instead of being substantially vertical, the sidewalls 413 may be sloped. In a particular embodiment, the sidewalls 413 may provide a cross-section to the vias 414 that is substantially hourglass shaped. Such a cross-section may be typical of laser-assisted etching processes, such as those described in greater detail above.

Figure 4D:
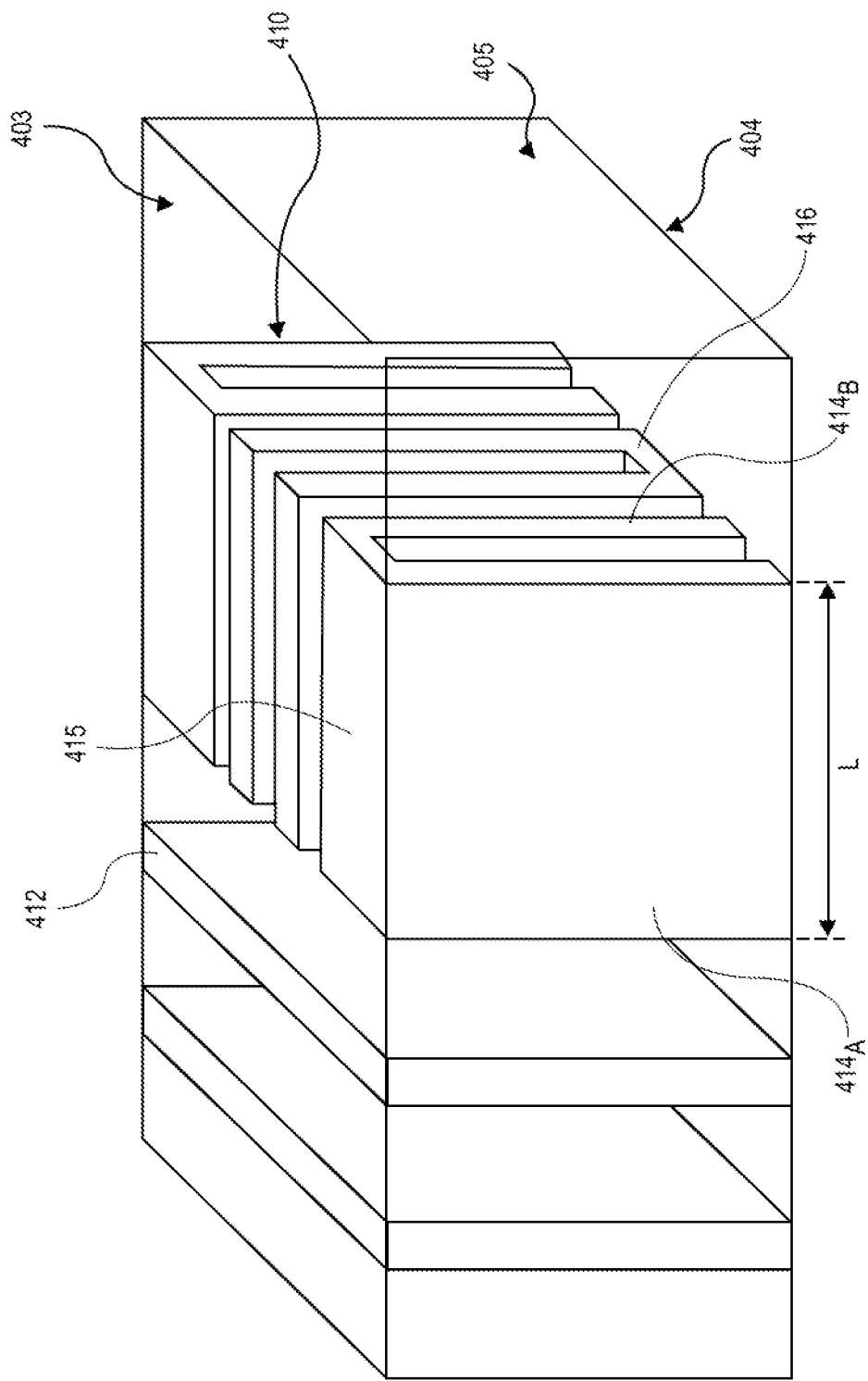
FIG. 4D is a perspective view illustration of a coupled-line filter with vertically oriented hairpin resonators that are extend to provide vertically oriented planes, in accordance with an embodiment.

Referring now to FIG. 4D, a perspective view illustration of a filter 410 in a core 405 is shown, in accordance with an additional embodiment. The filter 410 in FIG. 4D may be substantially similar to the filter 410 in FIG. 4A, with the exception that the vias $414_A$ and $414_B$ are extended to form via planes. As shown, the via planes $414_A$ and $414_B$ have a length L. It is to be appreciated that the laser-assisted etching process allows for substantially any length L to be obtained by scanning the laser across the surface of the core 405.

Figure 4E:
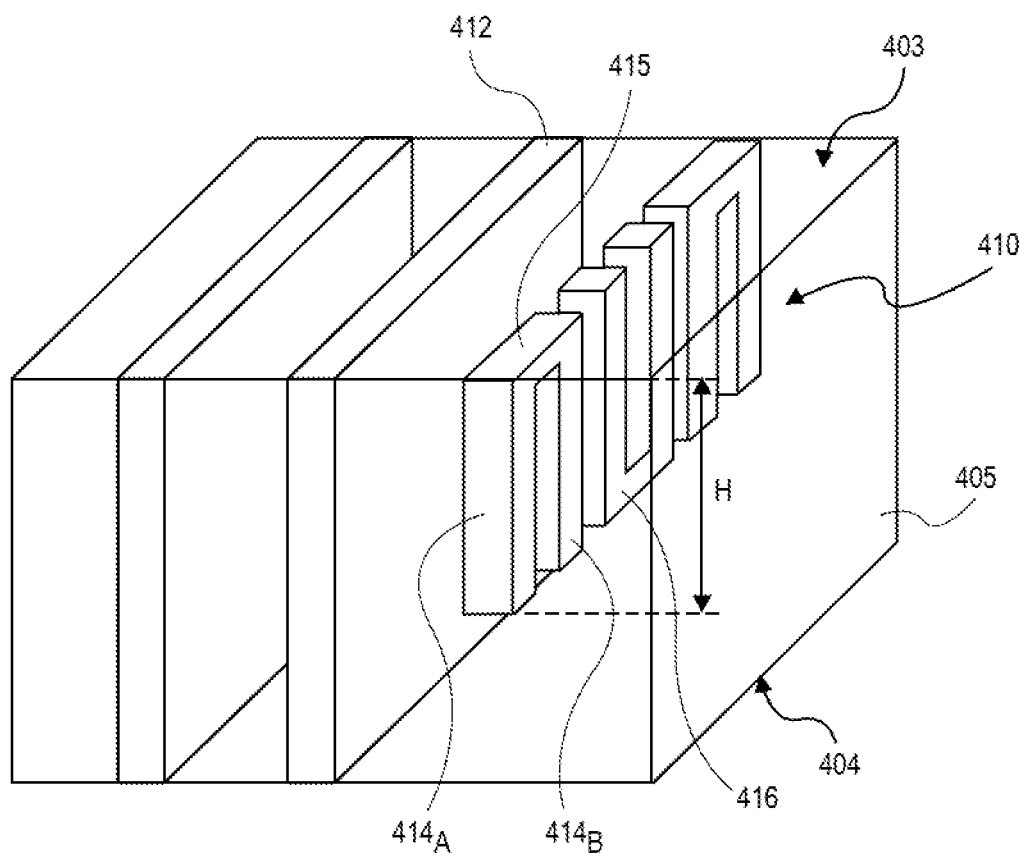
FIG. 4E is a perspective view illustration of a coupled-line filter with vertically oriented hairpin resonators with a height that is less than a thickness of the core, in accordance with an embodiment.

Referring now to FIG. 4E, a perspective view illustration of a filter 410 in a core 405 is shown, in accordance with an additional embodiment. The filter 410 in FIG. 4E may be substantially similar to the filter 410 in FIG. 4A, with the exception of the height H of the filter 410 being less than the thickness of the core 405. Particularly, the ability to form blind features in the core 405 with the laser-assisted etching process allows for variation in the height H of the filter 410. Buried vias $414_A$ and $414_B$ allow for filters 410 of different frequency ranges to be obtained. In some embodiments, the core 405 may comprise a plurality of filters 410, with each filter having different heights H.

An alternative set of filters, known as cavity filters, can also be fabricated in the core using laser-assisted etching techniques. Particularly, via planes can be used to form an outer shell. Interior walls within the outer shell may also be formed as via planes. The interior walls provide discrete cavities within the outer shell to provide the filtering. In some embodiments, the cavities may be loaded with a conductive block that can also be fabricated with laser-assisted etching processes.

Figure 5A:
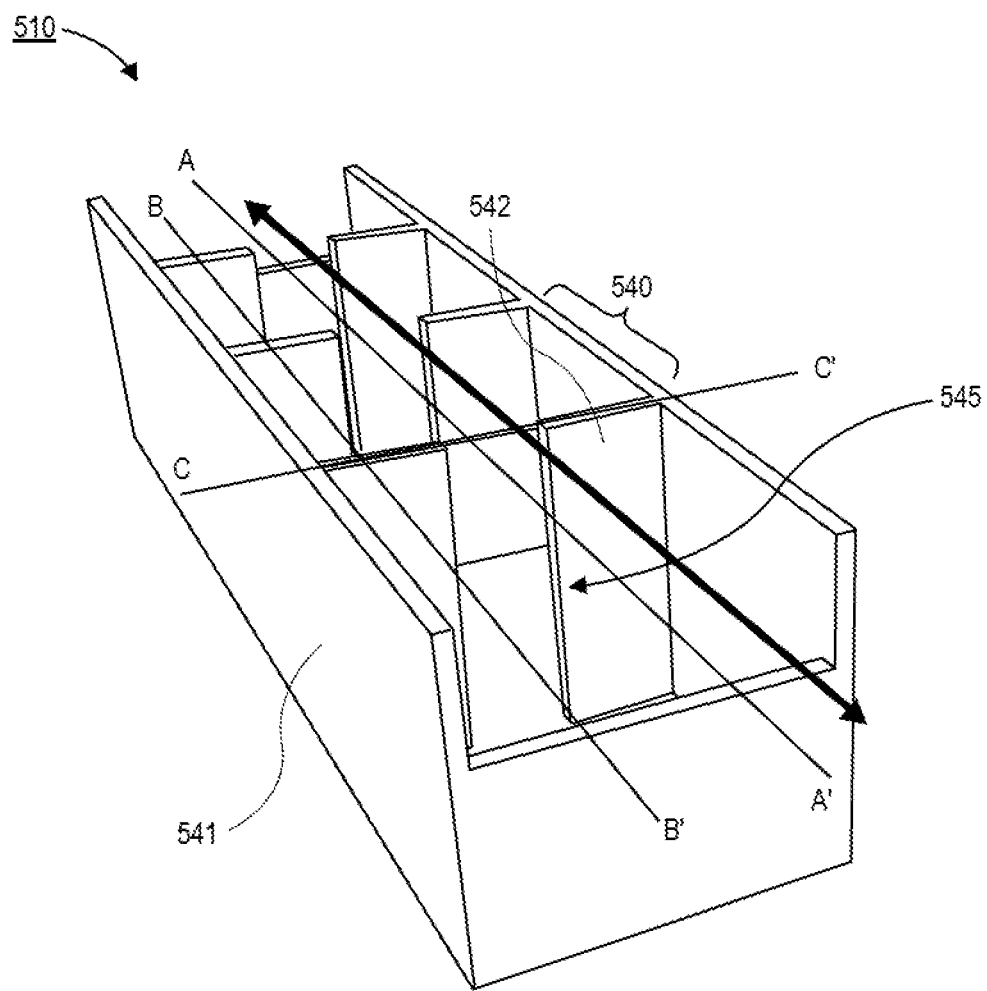
FIG. 5A is a perspective view illustration of a cavity filter that is fabricated with via planes, in accordance, with an embodiment.

Referring now to FIG. 5A, a perspective view illustration of a cavity filter 510 is shown, in accordance with an embodiment. In the illustrated embodiment, the lid is omitted for clarity. Additionally, the core material is omitted in order to not obscure embodiments disclosed herein. However, it is to be appreciated that the core may fill the cavities. Cavity filters are band-pass filters, and each cavity contributes to the filtering. However, each cavity contributes to losses. As such, the design of the filter is a balance between how steep the filter can filter a signal and how high the signal losses can be in the filter. Other design features include loading or unloading the cavities with conductive features. The frequency band is chosen by the geometries of the resonant cavity. Due to the flexibility of laser-assisted etching processes, many different geometries can be fabricated to provide the desired frequency band, and multiple different cavity filters with different geometries can be fabricated within a single core.

In an embodiment, the filter 510 may comprise an outer shell 541. The outer shell 541 may include a pair of sidewalls and a pair of end walls. The sidewalls of the outer shell 541 may extend through an entire thickness of the core. In an embodiment, the end walls of the outer shell 541 may have a height that is less than the thickness of the core. The reduced thickness of the end walls allows for the electromagnetic wave to enter and exit the outer shell 541. In an embodiment, the outer shell 541 may be fabricated using laser-assisted etching processes to form via planes. In a particular embodiment, the end walls may be blind via planes.

In an embodiment, the filter 510 may further comprise interior walls 542. The interior walls may also extend through an entire thickness of the core. In an embodiment, the interior walls 542 define a plurality of cavities 540 within the outer shell 541. For example, four cavities 540 are illustrated in FIG. 5A. However, it is to be appreciated that any number of cavities 540 may be used in order to provide a desired filtering performance. In an embodiment, the interior walls 542 may comprise openings 545. The openings 545 provide a path for the electromagnetic wave to propagate through the filter 510.

Figure 5B:
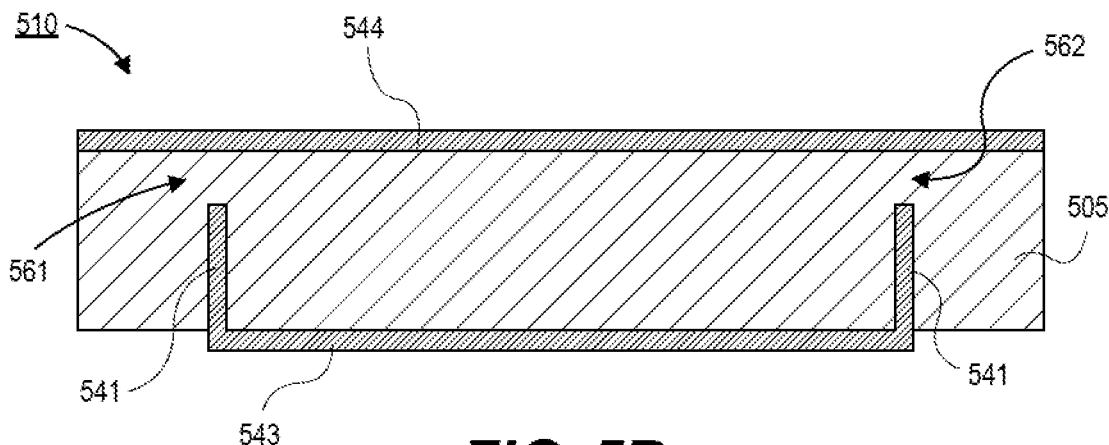
FIG. 5B is a cross-sectional illustration of the cavity filter in FIG. 5A along line A-A', in accordance with an embodiment.

Referring now to FIG. 5B, a cross-sectional illustration of the filter 510 in FIG. 5A along line A-A' is shown, in accordance with an embodiment. As shown, a lid 544 is over a top of the filter 510 and a floor 543 is provided along a bottom of the filter 510. The lid 544 and the floor 543 may be provided above and below the core 505. As shown in FIG. 5B, the end walls of the outer shell 541 do not extend through an entire thickness of the core 505. That is, the end walls are blind via planes. The reduced height of the end walls provides an input 561 and an output 562 to the filter 510. In the illustrated embodiment, the input 561 and the output 562 are on opposite ends of the filter 510.

In an embodiment, the filter 510 is a low loss filter due to the material of the core 505. For example, glass is a very low loss material. However, it is to be appreciated that the cavities 540 may be filled with a material other than the core 505. For example, a low loss material may replace the core 505 within the outer shell 541.

Figure 5C:
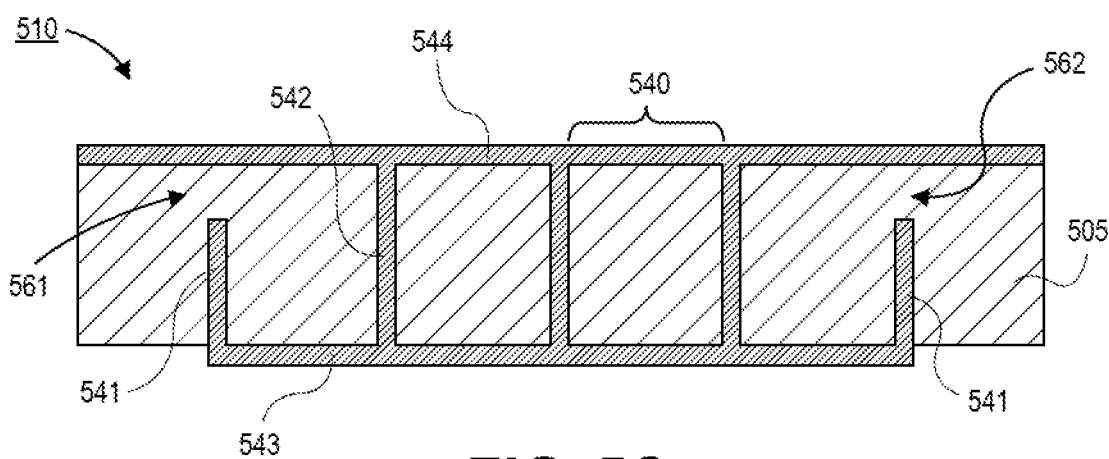
FIG. 5C is a cross-sectional illustration of the cavity filter in FIG. 5A along line B-B', in accordance with an embodiment.

Referring now to FIG. 5C, a cross-sectional illustration of the filter 510 in FIG. 5A along line B-B' is shown, in accordance with an embodiment. As shown, the plurality of cavities 540 are defined by interior walls 542. The interior walls 542 may extend through an entire thickness of the core 505. That is, the interior walls 542 may contact both the floor 543 and the lid 544. While shown as fully enclosed in FIG. 5C, it is to be appreciated that the cavities 540 are coupled together by openings 545 (out of the plane of FIG. 5C).

Figure 5D:
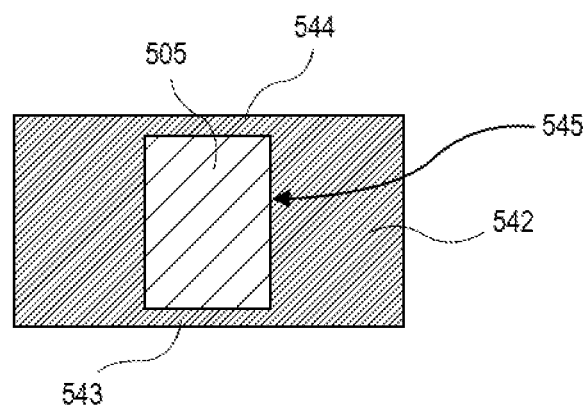
FIG. 5D is a cross-sectional illustration of the cavity filter in FIG. 5A along line C-C', in accordance with an embodiment.

Referring now to FIG. 5D, a cross-sectional illustration of the filter 510 in FIG. 5A along line C-C' is shown, in accordance with an embodiment. As shown, the interior wall 542 comprises an opening 545. The opening 545 may extend from the floor 543 to the lid 544. In other embodiments, the opening 545 may have a height that is smaller than the thickness of the core 505. In such an embodiment, the left side of the interior wall 542 may be connected to the right side of the interior wall 542 within the core in addition to the connections provided by the lid 544 and the floor 543.

In FIGS. 5A-5D the vertically oriented planes for the exterior shell 541 and the interior walls 542 are shown as having substantially vertical sidewall surfaces. However, it is to be appreciated that the use of laser-assisted etching processes to form the exterior shell 541 and the interior walls 542 may result in sidewalls that are tapered. In some embodiments, cross-sections of the exterior shell 541 and the interior walls 542 may have hourglass shapes.

Figure 6A:
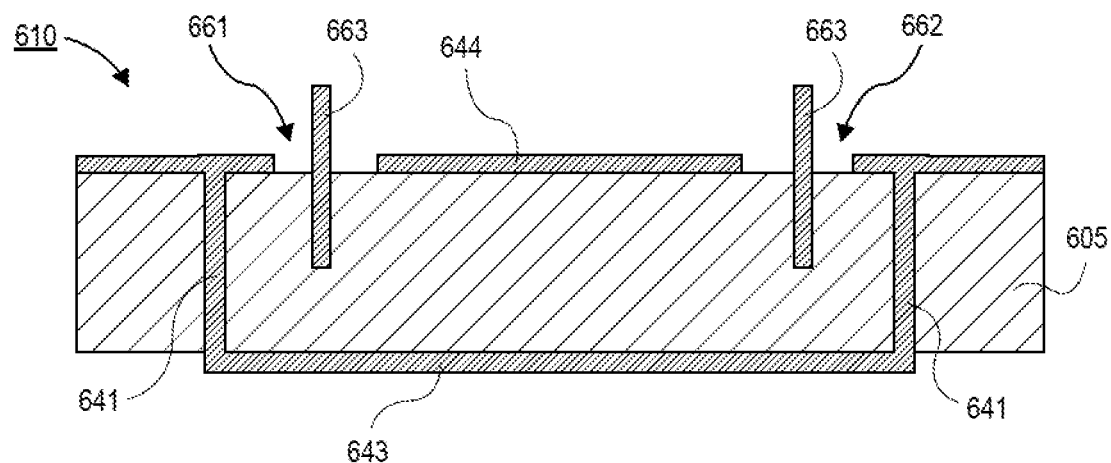
FIG. 6A is a cross-sectional illustration of a cavity filter with a vertical probe excitation configuration, in accordance with an embodiment.
Figure 6B:
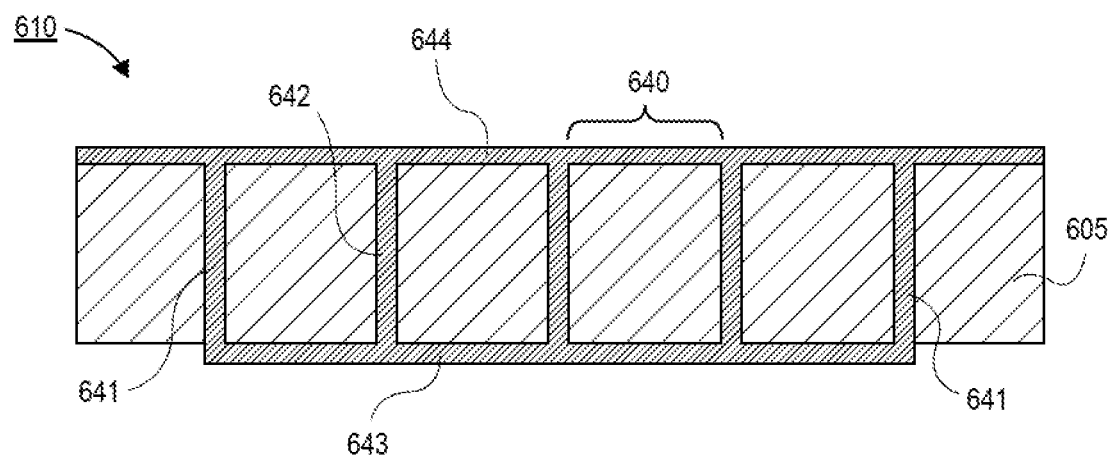
FIG. 6B is a cross-sectional illustration of a cavity filter with a vertical probe excitation configuration along a different plane than what is shown in FIG. 6A, in accordance with an embodiment.

Referring now to FIGS. 6A and 6B, a cavity filter 610 is shown in accordance with an additional embodiment. The signal may be provided to the cavity filter 610 through the use of vertical probe excitation. As shown in FIG. 6A (which is cross-section along a plane similar to line A-A' in FIG. 5A), input 661 and output 662 are provided through the lid 644. A vertical probe 663 may be inserted into the input 661 and the output 662. In such embodiments, the entire outer shell 641 may have a thickness that is substantially equal to the thickness of the core 605. The bottom of the cavity filter 610 may be sealed by a floor 643. Similarly, as shown in FIG. 6B (which is a cross-section along a plane similar to line B-B' in FIG. 5A), there is no input or output. Instead, the outer shell 641 extends from the floor 643 up to the lid 644. In FIG. 6B, each of the interior walls 642 and the outer shell 641 define cavities 640 that appear fully sealed. However, openings through the interior walls 642 (not visible in FIG. 6B) couple each of the cavities 640 together.

Figure 7A:
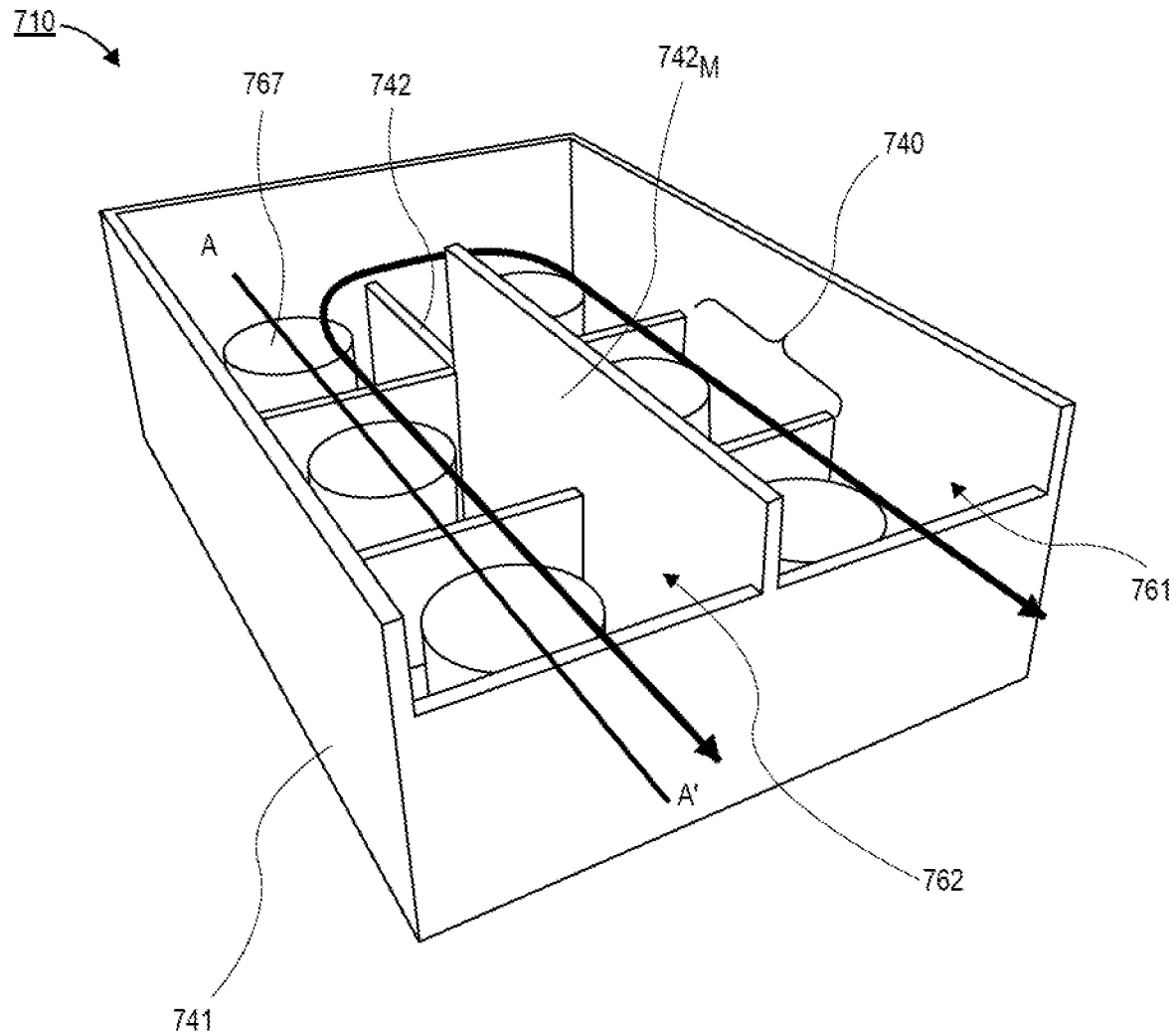
FIG. 7A is a perspective view illustration of a cavity filter with an input and an output that are on the same side of the outer shell, in accordance with an embodiment.

Referring now to FIG. 7A, a perspective view illustration of a cavity filter 710 is shown, in accordance with an additional embodiment. As shown, the cavity filter 710 comprises an input 761 and an output 762 that are on the same end of the outer shell 741. The cavities 740 have an out and back pattern with only a single wall of the outer shell 741 having a height that is less than the thickness of the core.

In an embodiment, the interior walls 742 may not extend up to the top surface of the core either, with the exception of a middle interior wall 742M that does extend through an entire thickness of the core. In an embodiment, the cavities 740 may be loaded with conductive structures 767. The conductive structures 767 in FIG. 7A are illustrated as being cylindrical. But it is to be appreciated that the conductive structures 767 may be any shape. The conductive structures 767 may also be formed with laser-assisted etching processes.

Figure 7B:
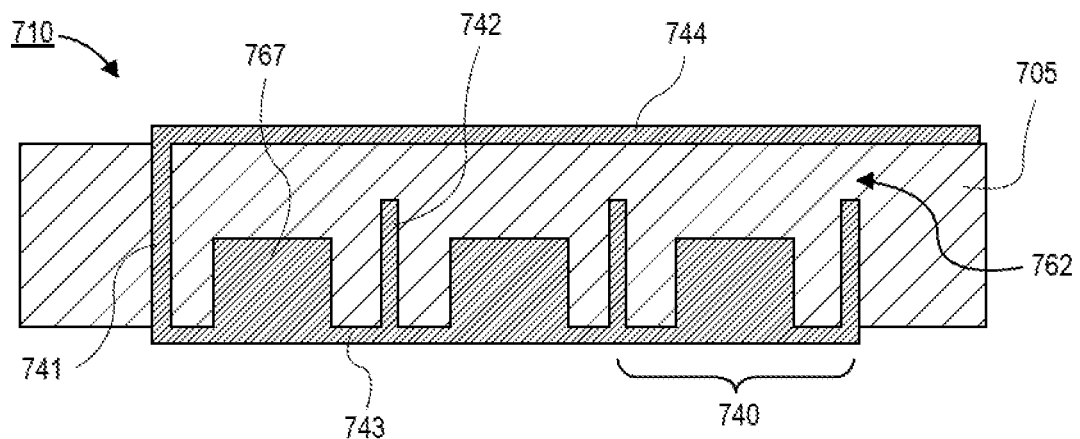
FIG. 7B is a cross-sectional illustration of the cavity filter in FIG. 7A along line A-A', in accordance with an embodiment.

Referring now to FIG. 7B, a cross-sectional illustration of the cavity filter 710 in FIG. 7A along line A-A' is shown, in accordance with an embodiment. As shown, the outer shell 741 extends through a complete thickness of the core 705 between a floor 743 and a lid 744 on one end, and on the opposite end an output 762 is provided through the outer shell 741. The interior walls 742 and the conductive structures 767 are also blind features that do not extend entirely through a thickness of the core 705. However, it is to be appreciated that in some embodiments, the interior walls 742 may extend through an entire thickness of the core 705. In such embodiments, openings through the interior walls 742 may couple together the cavities 740, similar to the openings 545 in the embodiment shown in FIG. 5A.

Figure 7C:
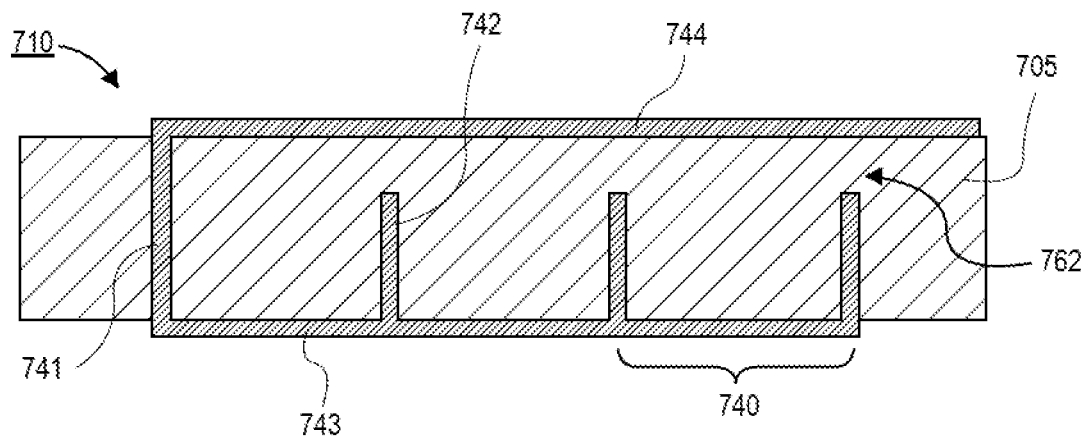
FIG. 7C is a cross-sectional illustration of the cavity filter without cavity loading, in accordance with an embodiment.

Referring now to FIG. 7C, a cross-sectional illustration of a cavity filter 710 is shown, in accordance with an additional embodiment. In an embodiment, the cavity filter 710 in FIG. 7C is substantially similar to the cavity filter 710 in FIG. 7B, with the exception of the removal of the conductive features 767. That is, the cavities 740 in FIG. 7C are unloaded.

Figure 8A:
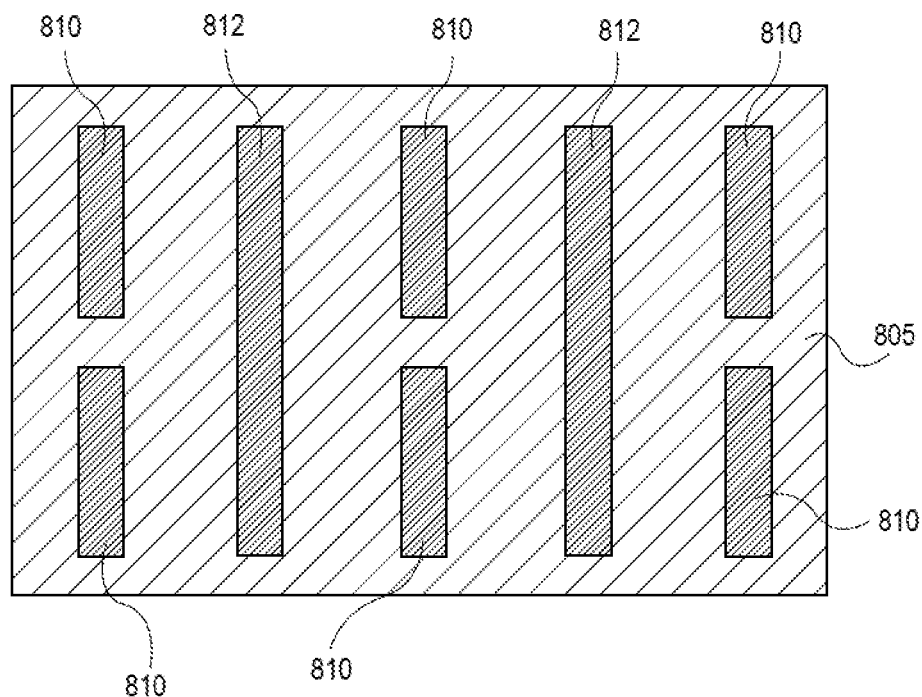
FIG. 8A is a plan view illustration of a plurality of filters in accordance with an embodiment.
Figure 8B:
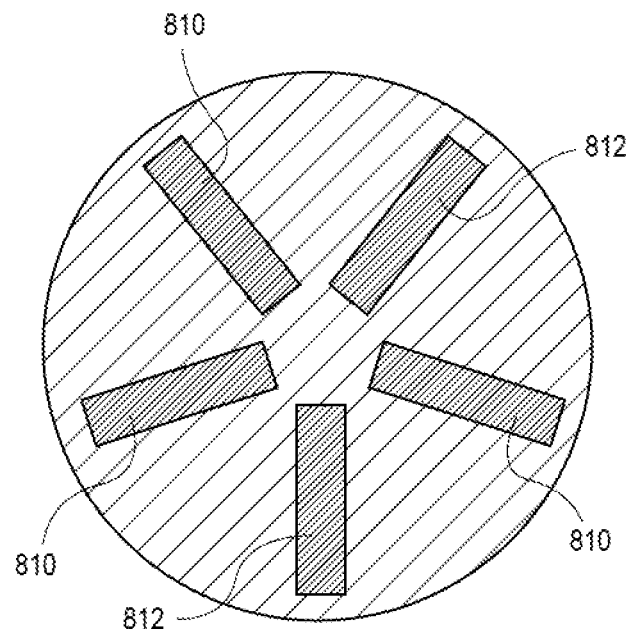
FIG. 8B is a plan view illustration of a plurality of filters in accordance with an embodiment.

Referring now to FIGS. 8A and 8B, plan view illustrations of a core 805 with multiple bandpass filters 810 are shown, in accordance with an additional embodiment. Multiple bandpass filters 810 can be combined to obtain multiplexer functionality. In FIG. 8A, the filters 810 are arranged in a grid with ground planes 812 in between filters 810. In FIG. 8B, the filters 810 are arranged radially with ground planes 812 between several of the filters 810. In FIGS. 8A and 8B, the filters 810 are generically illustrated as a single via plane. However, it is to be appreciated that the filters 810 may be similar to any of the filters described in greater detail herein.

Figure 9:
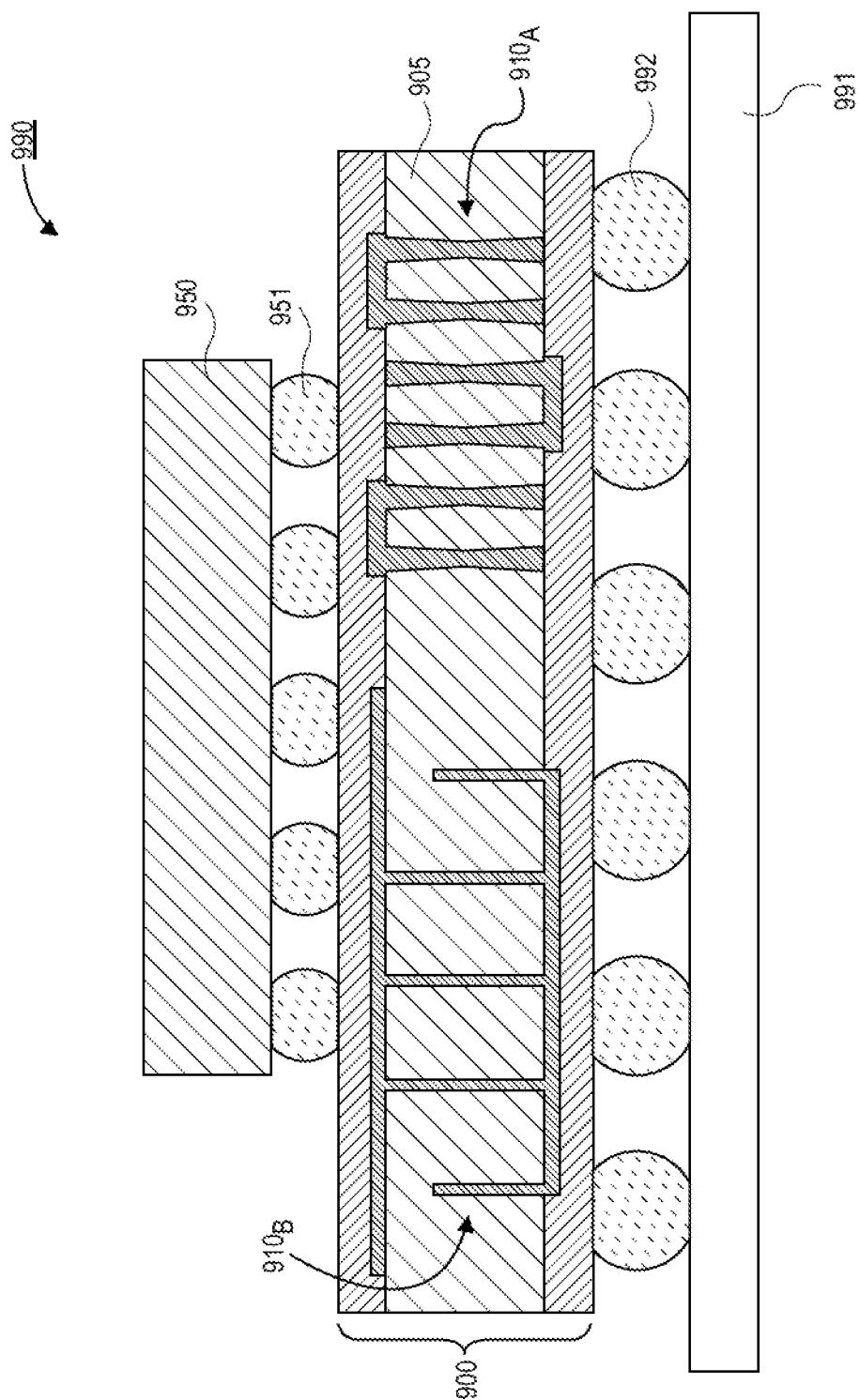
FIG. 9 is a cross-sectional illustration of an electronic system with filters integrated into the core, in accordance with an embodiment.

Referring now to FIG. 9, a cross-sectional illustration of an electronic system 990 is shown, in accordance with an embodiment. In an embodiment, the electronic system 990 may comprise a board 991, such as a printed circuit board (PCB). The board 991 may be coupled to a package substrate 900 by interconnects 992. The interconnects 992 may comprise solder balls, sockets or the like. The package substrate may comprise a core 905. In an embodiment, one or more filters 910 may be provided within the core 905. For example a first filter $910_A$ may be a coupled-line filter, such as a hairpin filter, and a second filter 910E may be a cavity filter. It is to be appreciated that any filter in accordance with embodiments described herein, or any combination of filters may be included in or partially in the core 905.

In an embodiment, a die 950 may be coupled to the package substrate 900 by FLIs 951. The FLIs 951 may comprise solder, copper pillars, or any other FLI architecture. In an embodiment, the die 950 may be a processor, a graphics processor, a system on a chip (SoC), a transceiver die, or any other type of die. In another embodiment, the die 950 may be an interposer onto which additional dies are attached. For example, the die 950 may stitch together a plurality of dies that are fabricated at a node more advanced than the node of the die 950.

Figure 10:
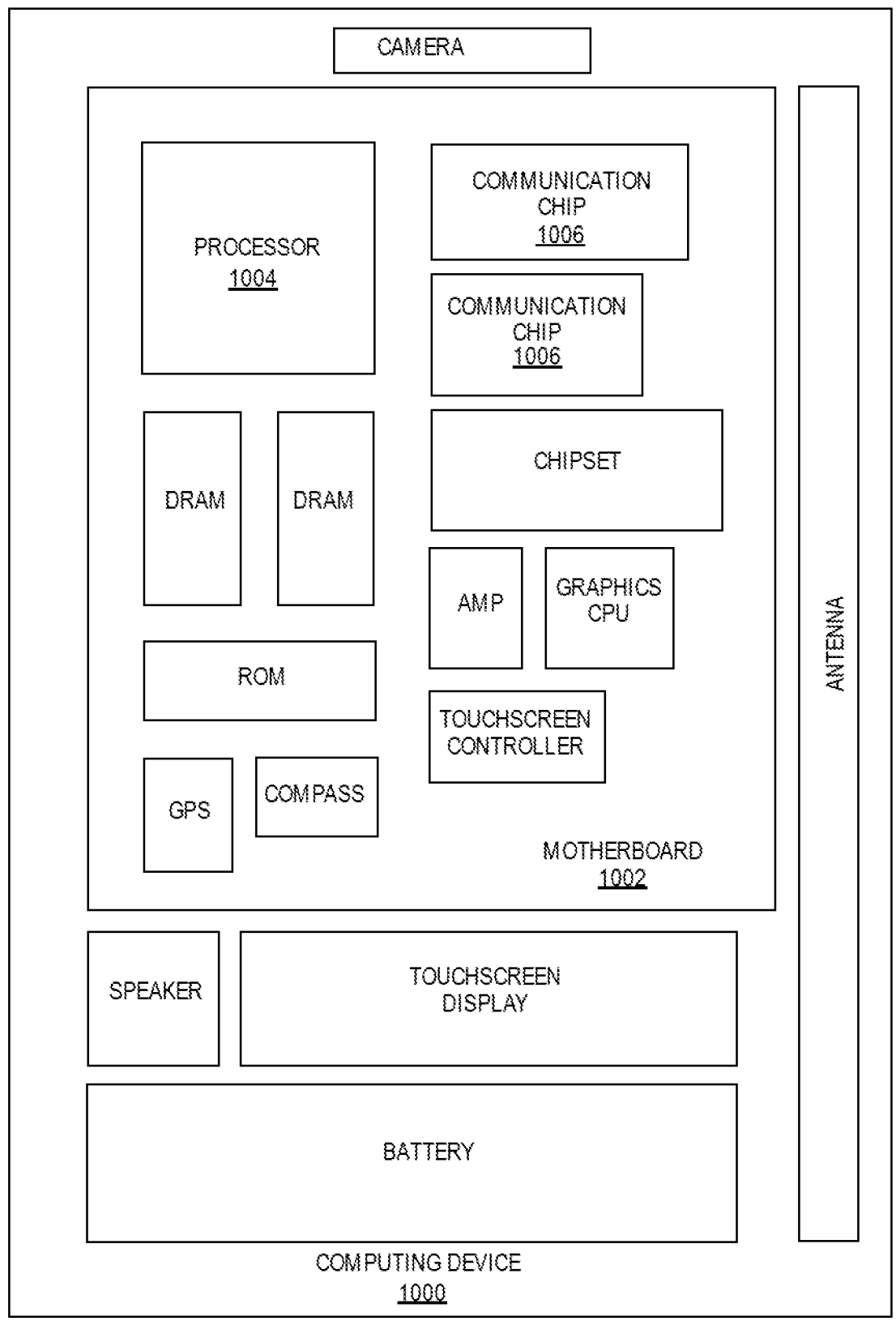
FIG. 10 is a schematic of a computing device built in accordance with an embodiment.

FIG. 10 illustrates a computing device 1000 in accordance with one implementation of the invention. The computing device 1000 houses a board 1002. The board 1002 may include a number of components, including but not limited to a processor 1004 and at least one communication chip 1006. The processor 1004 is physically and electrically coupled to the board 1002. In some implementations the at least one communication chip 1006 is also physically and electrically coupled to the board 1002. In further implementations, the communication chip 1006 is part of the processor 1004.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. In some implementations of the invention, the integrated circuit die of the processor may be part of an electronic package that comprises a package substrate with a core that is patterned with a laser-assisted etching process to form filters embedded in the core, in accordance with embodiments described herein. The term "processor" may refer to any device or portion of a device that processes electronic data from registers and/or memory to transform that electronic data into other electronic data that may be stored in registers and/or memory.

The communication chip 1006 also includes an integrated circuit die packaged within the communication chip 1006. In accordance with another implementation of the invention, the integrated circuit die of the communication chip may be part of an electronic package that comprises a package substrate with a core that is patterned with a laser-assisted etching process to form filters embedded in the core, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: a package substrate, comprising: a core with a first surface and a second surface; and a filter embedded in the core, wherein the filter comprises: a ground plane, wherein the ground plane is substantially orthogonal to the first surface of the core; and a resonator adjacent to the ground plane.

Example 2: the package substrate of Example 1, wherein the resonator comprises: a first via through a thickness of the core; a second via through the thickness of the core; and a trace over the first surface of the core, wherein the trace connects the first via to the second via.

Example 3: the package substrate of Example 2, wherein the first via and the second via extend entirely through the thickness of the core from the first surface of the core to the second surface of the core.

Example 4: the package substrate of Example 2, wherein the first via and the second via extend through a partial thickness of the core.

Example 5: the package substrate of Examples 2-4, wherein the first via and the second via have sidewall surfaces that are sloped.

Example 6: the package substrate of Example 5, wherein cross-sections of the first via and the second via are hourglass shaped.

Example 7: the package substrate of Examples 2-6, further comprising: a second resonator adjacent to the ground plane, wherein the second resonator comprises: a third via through a thickness of the core; a fourth via through the thickness of the core; and a second trace over the second surface of the core, wherein the second trace connects the second via to the fourth via.

Example 8: the package substrate of Examples 2-7, wherein the first via is a first via plane, and wherein the second via is a second via plane.

Example 9: the package substrate of Examples 1-8, wherein the filter is a coupled-line filter.

Example 10: the package substrate of Example 9, wherein the filter is a hairpin filter.

Example 11: the package substrate of Examples 1-10, wherein the core is a glass core.

Example 12: a package substrate, comprising: a core with a first surface and a second surface; and a filter embedded in the core, wherein the filter comprises: an outer shell; interior walls within the outer shell, wherein the interior walls define a plurality of cavities that are coupled to each other by openings through the interior walls; a lid over the first surface of the core above the outer shell; and a floor over the second surface of the core and below the outer shell.

Example 13: the package substrate of Example 12, wherein the plurality of cavities are filled by the core.

Example 14: the package substrate of Example 12, wherein the plurality of cavities are filled by a material other than the core.

Example 15: the package substrate of Example 12, wherein an entrance of the filter is through the outer shell, and an exit of the filter is through the outer shell.

Example 16: the package substrate of Example 15, wherein the entrance and the exit are on opposite ends of the outer shell.

Example 17: the package substrate of Example 15, wherein the entrance and the exit are on the same end of the outer shell.

Example 18: the package substrate of Examples 12-17, wherein the filter uses vertical probe excitation.

Example 19: the package substrate of Examples 12-18, wherein sidewalls of the outer shell are sloped.

Example 20: the package substrate of Example 19, wherein a cross-section of the outer shell is hourglass shaped.

Example 21: the package substrate of Examples 12-20, wherein the plurality of cavities comprises three or more cavities.

Example 22: the package substrate of Examples 12-21, wherein the filter is a resonant cavity filter.

Example 23: the package substrate of Examples 12-22, wherein the core is a glass core.

Example 24: an electronic system, comprising: a board; a package substrate coupled to the board, wherein the package substrate comprises: a core; and a filter embedded in the core, wherein the filter comprises at least a via plane; and a die coupled to the package substrate.

Example 25: the electronic system of Example 24, wherein the filter is a coupled-line filter or a resonant cavity filter.

What is claimed is:

1. A package substrate, comprising:
   a core with a first surface and a second surface, the core having a thickness between the first surface and the second surface; and
   a filter embedded in the core, wherein the filter comprises:
   a ground plane, wherein the ground plane extends from the first surface to the second surface through the thickness of the core; and
   a resonator laterally spaced apart from the ground plane, wherein the resonator extends from the first surface to the second surface through the thickness of the core.

2. The package substrate of claim 1, wherein the resonator comprises:
   a first via through a thickness of the core;
   a second via through the thickness of the core; and
   a trace over the first surface of the core, wherein the trace connects the first via to the second via.

3. The package substrate of claim 2, wherein the first via and the second via extend entirely through the thickness of the core from the first surface of the core to the second surface of the core.

4. The package substrate of claim 2, wherein the first via and the second via extend through a partial thickness of the core.

5. The package substrate of claim 2, wherein the first via and the second via have sidewall surfaces that are sloped.

6. The package substrate of claim 5, wherein cross-sections of the first via and the second via are hourglass shaped.

7. The package substrate of claim 2, further comprising:
   a second resonator adjacent to the ground plane, wherein the second resonator comprises:
   a third via through a thickness of the core;
   a fourth via through the thickness of the core; and
   a second trace over the second surface of the core, wherein the second trace connects the second via to the fourth via.

8. The package substrate of claim 2, wherein the first via is a first via plane, and wherein the second via is a second via plane.

9. The package substrate of claim 1, wherein the filter is a coupled-line filter.

10. The package substrate of claim 9, wherein the filter is a hairpin filter.

11. The package substrate of claim 1, wherein the core is a glass core.

12. A package substrate, comprising:
    a core with a first surface and a second surface; and
    a filter embedded in the core, wherein the filter comprises:
    an outer shell;

interior walls within the outer shell, wherein the interior walls define a plurality of cavities that are coupled to each other by openings through the interior walls;

a lid over the first surface of the core above the outer shell; and a floor over the second surface of the core and below the outer shell.

13. The package substrate of claim 12, wherein the plurality of cavities are filled by the core.

14. The package substrate of claim 12, wherein the plurality of cavities are filled by a material other than the core.

15. The package substrate of claim 12, wherein an entrance of the filter is through the outer shell, and an exit of the filter is through the outer shell.

16. The package substrate of claim 15, wherein the entrance and the exit are on opposite ends of the outer shell.

17. The package substrate of claim 15, wherein the entrance and the exit are on the same end of the outer shell.

18. The package substrate of claim 12, wherein the filter uses vertical probe excitation.

19. The package substrate of claim 12, wherein sidewalls of the outer shell are sloped.

20. The package substrate of claim 19, wherein a cross-section of the outer shell is hourglass shaped.

21. The package substrate of claim 12, wherein the plurality of cavities comprises three or more cavities.

22. The package substrate of claim 12, wherein the filter is a resonant cavity filter.

23. The package substrate of claim 12, wherein the core is a glass core.

24. An electronic system, comprising:

a board;

a package substrate coupled to the board, wherein the package substrate comprises:
 a core with a first surface and a second surface, the core having a thickness between the first surface and the second surface; and
 a filter embedded in the core, wherein the filter comprises a ground plane, wherein the ground plane extends from the first surface to the second surface through the thickness of the core, and a resonator laterally spaced apart from the ground plane, wherein the resonator extends from the first surface to the second surface through the thickness of the core; and a die coupled to the package substrate.

25. The electronic system of claim 24, wherein the filter is a coupled-line filter or a resonant cavity filter.

* * * * *